United States Patent
Choi

(10) Patent No.: US 9,685,397 B2
(45) Date of Patent: Jun. 20, 2017

(54) SEMICONDUCTOR PACKAGE WITH CLIP STRUCTURE

(71) Applicant: JMJ Korea Co., Ltd., Bucheon-si (KR)

(72) Inventor: Yun Hwa Choi, Bucheon-si (KR)

(73) Assignee: JMJ KOREA CO., LTD., Bucheon-si (KR)

( * ) Notice: Subject to any disclaimer, the term of this patent is extended or adjusted under 35 U.S.C. 154(b) by 0 days.

(21) Appl. No.: 15/109,854

(22) PCT Filed: Sep. 9, 2015

(86) PCT No.: PCT/KR2015/009476
§ 371 (c)(1),
(2) Date: Jul. 6, 2016

(87) PCT Pub. No.: WO2016/043469
PCT Pub. Date: Mar. 24, 2016

(65) Prior Publication Data
US 2016/0336257 A1    Nov. 17, 2016

(30) Foreign Application Priority Data

Sep. 18, 2014 (KR) .................. 10-2014-0124510

(51) Int. Cl.
| H01L 23/495 | (2006.01) |
| H01L 23/00 | (2006.01) |
| H01L 23/40 | (2006.01) |
| H01L 21/48 | (2006.01) |

(52) U.S. Cl.
CPC .... H01L 23/49524 (2013.01); H01L 21/4842 (2013.01); H01L 23/4093 (2013.01);
(Continued)

(58) Field of Classification Search
CPC .......... H01L 23/4093; H01L 23/49524; H01L 23/49551; H01L 23/49555; H01L 24/32;
(Continued)

(56) References Cited

U.S. PATENT DOCUMENTS 9,391,005 B2 * 7/2016 Xue .................. H01L 23/49537
9,496,208 B1 * 11/2016 Ostrowicki ....... H01L 23/49575
(Continued)

FOREIGN PATENT DOCUMENTS

| KR | 10-2010-0095763 A | 9/2010 | |
| KR | 2010-0095763 A * | 9/2010 | ............. H01L 24/36 |

(Continued)

*Primary Examiner* — Stephen W Smoot
(74) *Attorney, Agent, or Firm* — KORUS Patent, LLC; Seong Il Jeong

(57) ABSTRACT

A semiconductor package comprise a downset has a first end coupled to a connection portion and a second opposite end electrically coupled to a lead of a lead frame; and an adhesion layer disposed between the lead and the second end of the downset to allow adhesion therebeween; wherein the downset is bent in a non-right angle at the first end thereof such that a bottom face of the second end of the downset is tilted toward a top face of the lead and thus a first side of both sides of the bottom face is closer to the top face of the lead than a second side opposite the first side, wherein a first trap region is defined between a side face of the second end at the first side and the top face of the lead to trap therein an adhesion material of the adhesion layer, wherein a second trap region is defined between the bottom face of the second end and the top face of the lead to trap therein an adhesion material of the adhesion layer.

12 Claims, 5 Drawing Sheets

(52) U.S. Cl.
CPC ........ *H01L 23/49555* (2013.01); *H01L 24/32* (2013.01); *H01L 24/40* (2013.01); *H01L 23/49541* (2013.01); *H01L 23/49548* (2013.01); *H01L 2224/32245* (2013.01); *H01L 2224/40095* (2013.01); *H01L 2224/40245* (2013.01); *H01L 2924/181* (2013.01)

(58) Field of Classification Search
CPC ........... H01L 24/40; H01L 2224/32059; H01L 2224/3207; H01L 2224/32245; H01L 2224/4007; H01L 2224/40095; H01L 2224/40245
See application file for complete search history.

(56) References Cited

U.S. PATENT DOCUMENTS

| | | | | |
|---|---|---|---|---|
| 2004/0063240 | A1* | 4/2004 | Madrid | H01L 23/49524 |
| | | | | 438/106 |
| 2011/0008936 | A1* | 1/2011 | Tellkamp | H01L 23/49548 |
| | | | | 438/123 |
| 2013/0256852 | A1 | 10/2013 | Wyant et al. | |
| 2015/0243587 | A1* | 8/2015 | Yang | H01L 23/49551 |
| | | | | 257/669 |

FOREIGN PATENT DOCUMENTS

| | | | |
|---|---|---|---|
| KR | 10-2011-0100933 | A | 9/2011 |
| KR | 10-20110117211 | A | 10/2011 |
| KR | 10-2012-0000249 | A | 1/2012 |
| KR | 10-2012-0051902 | A | 5/2012 |
| KR | 10-2014-0073241 | A | 6/2014 |

\* cited by examiner

SEMICONDUCTOR PACKAGE WITH CLIP STRUCTURE

BACKGROUND

Field of the Present Disclosure

The present disclosure relates to a semiconductor package, and, more particularly, to a semiconductor package with a clip structure.

Discussion of the Related Art

The semiconductor package include a semiconductor chip or die, a lead frame and a package body. The semiconductor chip or die may be attached onto a die pad of the lead frame. The lead frame has a lead coupled to the chip via a wire. When the electrical connection between the semiconductor chip and an external portion to the package employs a metal wire, a signal transfer rate is low. Further, a larger number of the wires may lead to deterioration in electrical property of the semiconductor chip. The larger number of the wires may lead to a requirement of an addition installation space. The wire bonding for the pad of the semiconductor chip requires a gap to increase a height of the package.

When the power chip package including a power semiconductor element such as a power MOSFET or IGBT is involved, a small switching loss and conduction loss are sought. Further, a low drain-source on-resistance (Rds ON) is sought. The semiconductor package may be used in a switching mode power supply, DC-DC converter, an inverter of an electric motor, etc.

These elements may be sought to have an enhanced energy efficiency and reduction of the heat. Further, a small resistance in a wire contacting a main terminal and a good heat dissipation are sought.

SUMMARY

From considerations of the above situations, the present disclosure provides a semiconductor package with improved adhesion reliance between a lead of a lead frame and a downset of a clip structure and thus suppression of deterioration in electrical property of the semiconductor chip.

In an aspect of the present disclosure, there is provided a semiconductor package comprising: a lead frame including a lead and a pad spaced from the lead; a semiconductor chip mounted on the pad; a clip structure including a chip contact portion, a downset, and a connection portion connecting the chip contact portion and the downset, wherein the chip contact portion is disposed over and is electrically connected to the semiconductor chip, wherein the downset has a first end coupled to the connection portion and a second opposite end electrically coupled to the lead of the lead frame; and an adhesion layer disposed between the lead and the second end of the downset to allow adhesion therebeween; wherein the downset is bent in a non-right angle at the first end thereof such that a bottom face of the second end of the downset is tilted toward a top face of the lead and thus a first side of both sides of the bottom face is closer to the top face of the lead than a second side opposite the first side, wherein a first trap region is defined between a side face of the second end at the first side and the top face of the lead to trap therein an adhesion material of the adhesion layer, where the first trap region has a first trap angle; wherein a second trap region is defined between the bottom face of the second end and the top face of the lead to trap therein an adhesion material of the adhesion layer, where the second trap region has a second trap angle.

In one embodiment, the first trap angle is in a range between 30° and 90°.

In one embodiment, the first trap angle is in a range between 30° and 65°.

In one embodiment, the first trap angle is in a range between 45° and 80°.

In one embodiment, the second trap angle is in a range between 0° and 60°.

In one embodiment, the second end has a sharp edge at the first side of the bottom face.

In one embodiment, the second end has a round edge at the first side of the bottom face.

In one embodiment, the chip contact portion has a mesa field protruding downwards relative to a bottom of the connection portion, wherein a bottom of the chip contact portion and a bottom of the connection portion have different vertical levels.

In one embodiment, the chip contact portion has a concave groove formed therein, wherein a top level of the chip contact portion is lower than a top level of the connection portion.

In one embodiment, the clip structure has a groove defined in a bottom thereof between the chip contact portion and the connection portion.

In one embodiment, the clip structure has a restoration suppression groove formed in an outer side face of a bent portion between the connection portion and downset, wherein the restoration suppression groove functions to suppress restoration of the bending of the downset.

In one embodiment, the restoration suppression groove has a V shape having a defined angle along an inner side face thereof, the angle being between 10° and 180°.

In one embodiment, the restoration suppression groove has a round spherical shape.

In accordance with the present disclosure, the semiconductor package may have improved adhesion reliance between the lead of the lead frame and the downset of the clip structure and thus suppression of deterioration in electrical property of the semiconductor chip.

BRIEF DESCRIPTIONS OF THE DRAWINGS

DETAILED DESCRIPTIONS

Figure 1:
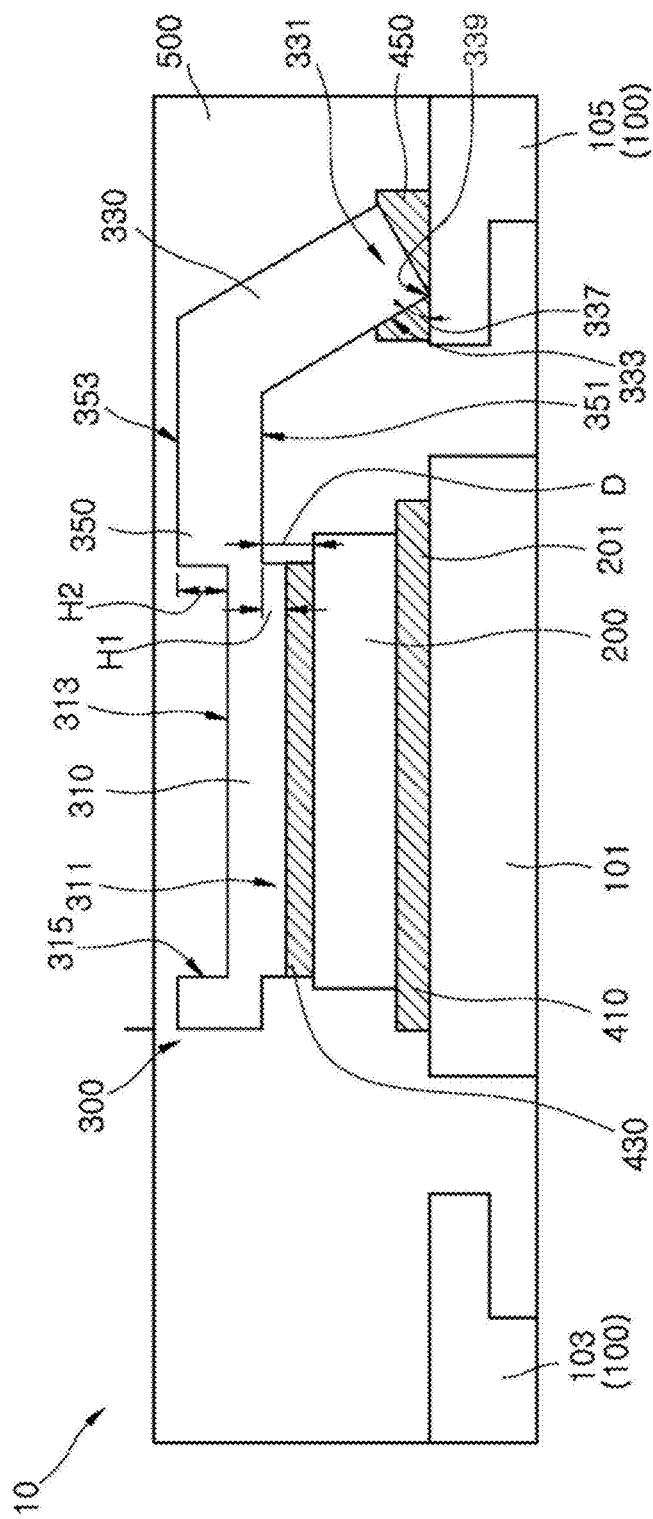
FIG. 1 shows a side cross sectional view of a semiconductor package including a clip structure one embodiment of the present disclosure.

Examples of various embodiments are illustrated in the accompanying drawings and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section.

Thus, a first element, component, region, layer or section described below could be termed a second element, component, region, layer or section, without departing from the spirit and scope of the present disclosure. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present. Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

Hereinafter, embodiments of the present disclosure will be described in details with reference to attached drawings.

The present semiconductor package may include a clip structure in a clip shape to realize an electrical connection between the semiconductor chip and the lead of the lead frame. The clip structure is used in place of a wire to realize a wireless package. The clip structure is attached to the semiconductor chip. This configuration may lead a better electrical and thermal performance over the wired configuration. The semiconductor package with the clip structure may be designed in the consumer circuit board and thus the board has unique footprints and pin allocation thereof.

FIG. 1 shows a side cross sectional view of a semiconductor package including a clip structure one embodiment of the present disclosure.

Referring to FIG. 1, one exemplary semiconductor package 10 may include a semiconductor chip 200, and a lead frame 100 to mount thereon the semiconductor chip 200. The semiconductor chip 200 may be implemented as a power element chip in one embodiment. The present disclosure is not limited thereto. The lead frame 100 has a lead frame pad 101 to mount thereon the semiconductor chip 200. Specifically, a terminal, for example, a drain of the semiconductor chip 200 formed at a bottom thereof may be electrically coupled to the lead frame pad 101. For example, when the semiconductor chip 200 include a power MOSFET, the lead frame pad 101 may be electrically coupled to a drain terminal of power MOSFET.

An adhesion between the semiconductor chip 200 and pad 101 may be achieved using a conductive adhesive which is referred to as a first adhesion layer 410. The first adhesion layer 410 may be embodied as a solder layer. The pad 101 may be electrically coupled to a bottom of the semiconductor chip 200.

The leads 103, 105 may act to deliver a signal from the semiconductor chip 200 out of the package. The first lead 103 may be formed of a conductive pattern spaced from the pad 101. The first lead 103 may be electrically connected to a gate pad or gate terminal formed on a top of the semiconductor chip 200. This electric connection may be embodied by a bonding wire (not shown) between a gate pad (not shown) and a first lead 103. The second lead 105 may be formed of a conductive pattern spaced from the pad 101 and first lead 103. The second lead 105 may be electrically connected via a clip structure 300 to a source terminal or source pad formed a top of the semiconductor chip 200.

On the lead frame pad 101, the semiconductor chip 200 may be mounted. A portion of the clip structure 300, for example, a chip contact portion 310 thereof may be coupled onto the semiconductor chip 200. The clip structure 300 may include a chip contact portion 310, and a downset 330, and a connection portion 350 connected between and to the chip contact portion 310 and the downset 330. The chip contact portion 310, and the downset 330, and the connection portion 350 may be integrated with each other or may be monolithic. For example, the clip structure 300 may be formed by machining a Cu conductive member to have a sheet shape.

The semiconductor chip 200 may have a MOSFET source electrode or an IGBT collector electrode as a current terminal on a top face of the semiconductor chip 200. The chip contact portion 310 of the clip structure 300 may be configured to be electrically connected to the current terminal on the chip 200. The chip contact portion 310 may act as a current channel. The sheet type clip structure 300 may have a larger contact area than a wire bonding structure to reduce a contact resistance, and may have a larger cross sectional area to reduce an on-resistance thereto. Further, the larger contact area may allow a heat discharge path from the semiconductor chip 200 to be extended to improve a heat discharge rate. The adhesion between the bottom 311 of the chip contact portion 310 and the top of the semiconductor chip 200 may be embodied by a second adhesion layer 430 including a solder as a conductive adhesive.

For the clip structure 300, a downset 330 may extend from the connection portion 350 extending from the chip contact portion 310. The downset 330 may extend from the connection portion 350 downwardly to the second lead 105. Between the connection portion 350 and the downset 330, a bent portion may be formed. The bent portion may bend downwardly. The bent portion may bend at a predetermined degree to extend downward and react the downset 330. The end 331 of downset 330 may face, in a closest manner, a top of the second lead 105 top. In this embodiment, the right angled extension between the contact portion 310 and the second lead 105 of the lead frame 100 is not defined. However, the non-right angled extension between the contact portion 310 and the second lead 105 of the lead frame 100 is not defined. In this connection, the connection of the clip structure 300 may act as a thermal connection between the semiconductor chip 200 and the second lead 105.

The downset 330 may be bent downwards in a non-right angle from the connection portion 350 extending from the chip contact portion 310. The downset 330 may have, at a free end 331 thereof, having a bottom 335 facing the top face of the second lead 105, and a side face 333 from the bottom 335 to have a defined angle with the top face of the second lead 105. Only a corner 339 defined by the side face 333 and bottom 335 may contact the second lead 105.

In one embodiment, the side face 333 and bottom 335 may define about 90° at the corner 339. The side face 333 may define an angle 337 between about 30° and 90° with the top face of the second lead 105. In another example, the side face 333 may define an angle 337 between about 30° and 65° or between about 45° and 80° with the top face of the second lead 105.

The downset 330 may have, at a free end 331 thereof, having a bottom 335 facing the top face of the second lead 105, and a side face 333 from the bottom 335 to have a defined angle with the top face of the second lead 105. That is, the angle 337 may be smaller than 90°. Thus, this angle 337 may be acute. This acute angel may act as a trap space. That is, the trap space may reliably secure therein an adhesive material, for example, a solder of a third adhesion layer 450. The angle defined between the bottom 335 and the top face of the second lead 105 may be set to between about 0° and 60°. The angle defined between the side face 333 and the top face of the second lead 105 may be acute to allow the surface tension to increase in the first trap region to allow more quantity of the solder to be received in the first trap region. Likewise, the angle defined between the bottom face 335 and the top face of the second lead 105 may be acute to allow the surface tension to increase in the second trap region to allow more quantity of the solder to be received in the second trap region. Thus, the second trap space may reliably secure therein an adhesive material, for example, a solder of a third adhesion layer 450. In this way, the third adhesion layer 450 may have a substantially increased adhesion thickness or area. The end 331 of the downset 330 may be secured to the second lead 105 more firmly or more reliably.

The clip structure 300 may have the chip contact portion 310 which may have a mesa field extending downwards relative to the bottom 351 of the connection portion 350. The chip contact portion 310 may have the bottom 311 distant from a bottom 351 of the connection portion 350 at a vertical distance H1. Thus, when viewed from the bottom, the combination of the chip contact portion 310 and downset 330 and connection portion 350 may have an arch shape. The connection portion 350 has the bottom 351 has a larger spacing D1 from a corner 201 of the semiconductor chip 200. The bottom 351 of the connection portion 350 may be more spaced from the corner 201 of the semiconductor chip 200, by the vertical distance H1, than the bottom 311 of the chip contact portion 310. The vertical distance H1 may be defined between the bottom 311 of the chip contact portion 310 and the bottom 351 of the connection portion 350.

For the power semiconductor chip 200, the corner 201 may be sensitive to the leakage current. Since the downset 330 is bent from connection portion 350 of the clip structure 300 downward in a non-right angle, the downset 330 may be relative closer to the corner 201. Thus, when the downset 330 unintentionally contacts the corner 201, the leakage current path may be established. In order prevent the contact between the corner 210 of the semiconductor chip 200 and the downset 330 or connection portion 350 and thus to suppress the leakage current, the spacing between the corner 201 and the bottom 351 of the connection portion 350 may be larger. For this, a step may be formed between the connection portion 350 and chip contact portion 310.

A concave groove 315 may be formed in the top 313 of the chip contact portion 310 to be lower vertically relative to the top 353 of the connection portion 350. The concave groove 315 may be formed at the same time when the mesa filed of the chip contact portion 310 is formed to protrude downwardly. The concave groove 315 may improve a top surface area of the chip contact portion 310 in a proportional to the vertical distance H2 between the top face 313 and the top 353 of the connection portion 350. Thus, the concave groove 315 may improve a heat dissipation rate from the clip structure 300. The clip structure 300 may be made of a copper and may be made of a Cu sheet having 0.1 mm to 1.5 mm thickness.

The semiconductor package 10 may further include an encapsulation 500 to be configured to encapsulate the semiconductor chip 200. The encapsulation 500 may protect the semiconductor chip 200 and clip structure 300. The encapsulation 500 may be made by molding an epoxy mold compound (EMC). The encapsulation 500 may expose the bottom of the lead frame 100 to enhance the heat dissipation.

Figure 2:
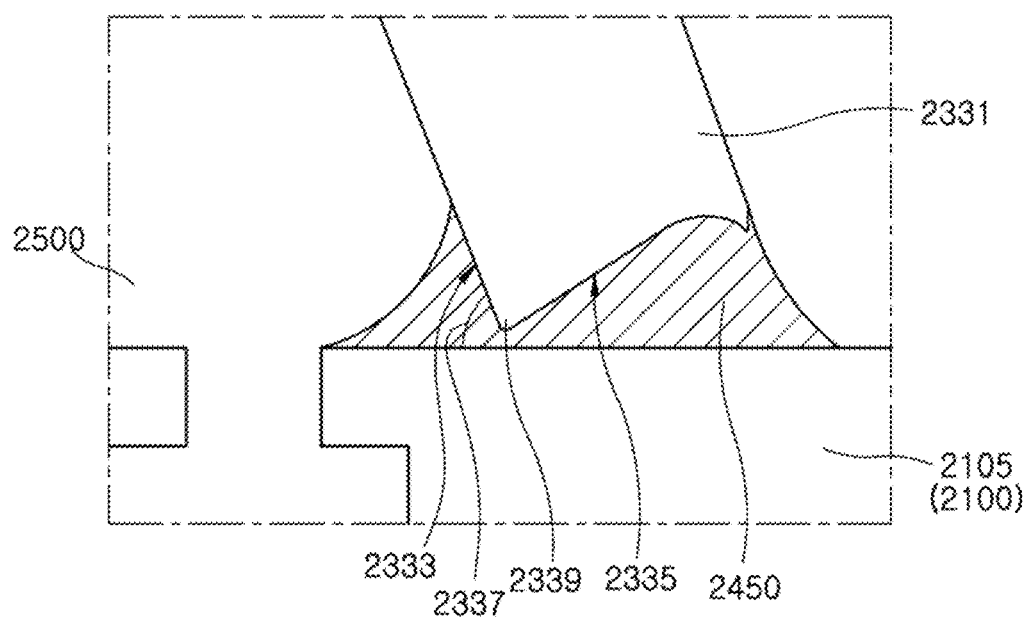
FIG. 2 and FIG. 4 show connections between a downset of a clip structure and a second lead of a lead frame in different embodiments.
Figure 3:
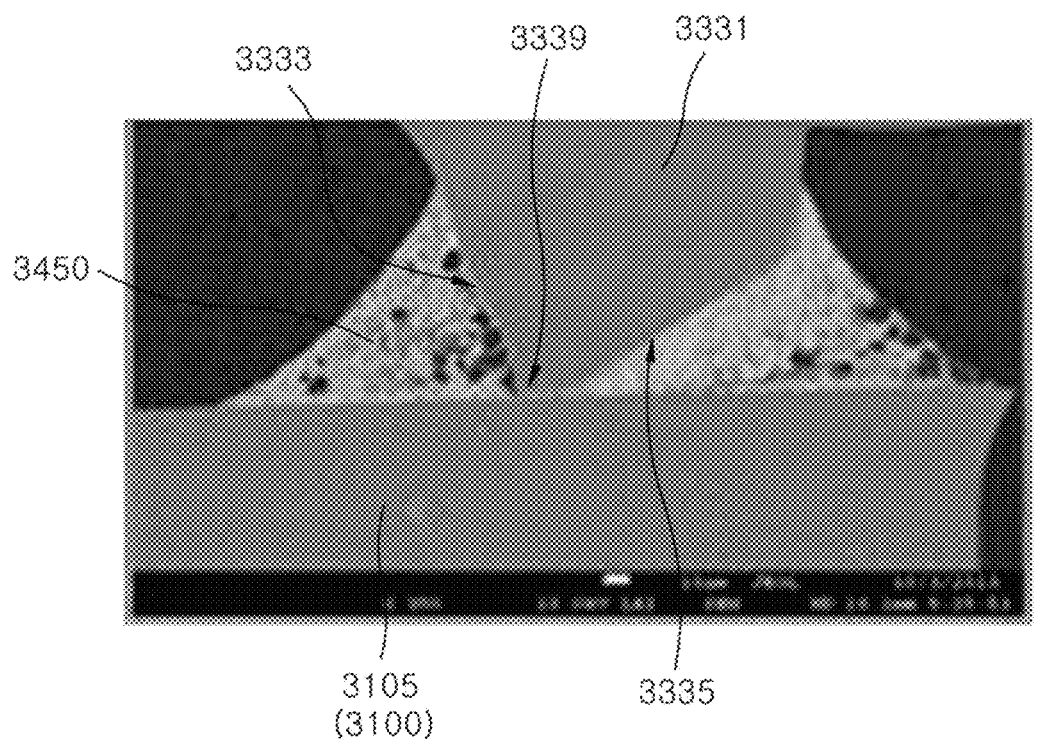
FIG. 3 and FIG. 5 show photographs of connections between a downset of a clip structure and a second lead of a lead frame in different embodiments.
Figure 4:
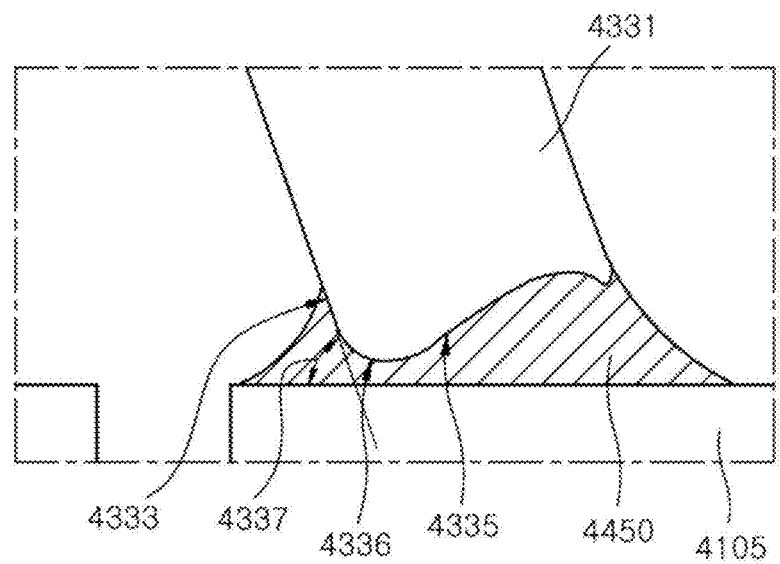
Figure 5:
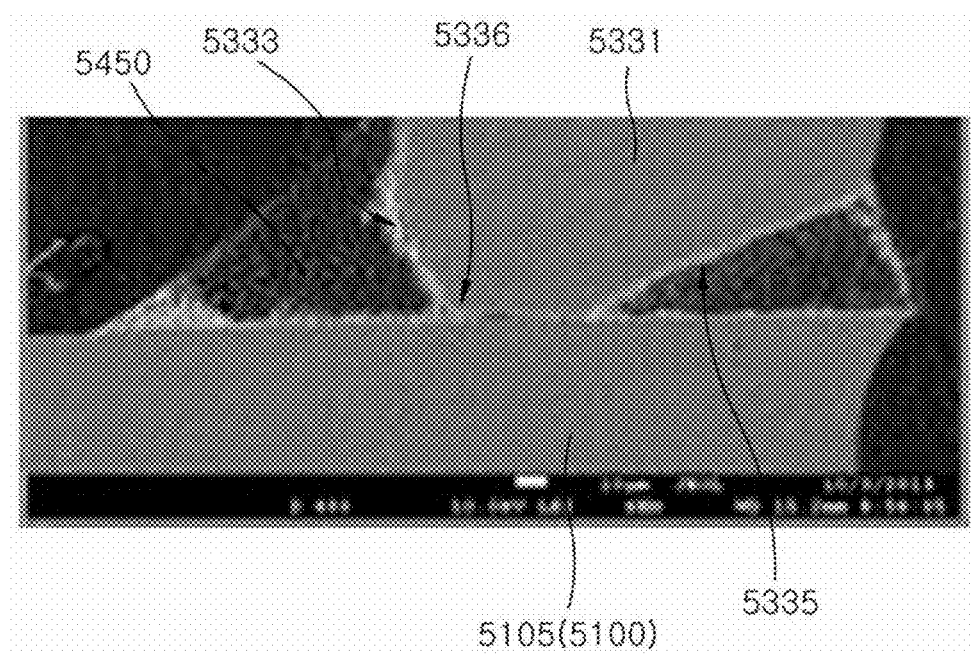

FIG. 2 and FIG. 4 shows connections between a downset of a clip structure and a second lead of a lead frame in different embodiments. FIG. 3 and FIG. 5 shows photographs of connections between a downset of a clip structure and a second lead of a lead frame in different embodiments.

Referring to FIG. 2, the clip structure 300 in FIG. 1 may have the downset having one free end 2331 having a corner 2339 which faces, in a closest manner, the second lead 2105. The corner 2339 may have a sharp shape. The corner 2339 may be defined between the bottom 2335 and the side face 2333. The angle 2337 defined between the second lead 2105 of the lead frame 2100 and the side face 2333 may be acute to form a first trap region to reliably receive therein a solder in the adhesion layer 2450. The angle defined between the second lead 2105 of the lead frame 2100 and the bottom face 2335 may be acute to form a second trap region to reliably receive therein a solder in the adhesion layer 2450.

Referring to FIG. 3, the clip structure 300 in FIG. 1 may have the downset having one free end 3331 having a corner 3339 which faces, in a closest manner, the second lead 3105. The corner 3339 may have a sharp shape. The corner 3339 may be defined between the bottom 3335 and the side face 3333. The first angle defined between the second lead 3105 of the lead frame 3100 and the side face 3333 may be acute to form a first trap region to reliably receive therein a solder in the adhesion layer 3450. The second angle defined between the second lead 3105 of the lead frame 3100 and the bottom face 3335 may be acute to form a second trap region to reliably receive therein a solder in the adhesion layer 3450. This may be proved in the photograph as shown in FIG. 3.

Referring to FIG. 4, the clip structure 300 in FIG. 1 may have the downset having one free end 4331 having a corner 4336 which faces, in a closest manner, the second lead 4105. The corner 4336 may have a round shape. The corner 4336 may be defined between the bottom 4335 and the side face 4333. The angle 4337 defined between the second lead 4105 of the lead frame 4100 and the side face 4333 may be acute to form a first trap region to reliably receive therein a solder in the adhesion layer 4450. The second angle defined between the second lead 4105 of the lead frame 4100 and the bottom face 4335 may be acute to form a second trap region to reliably receive therein a solder in the adhesion layer 4450.

Referring to FIG. 5, the clip structure 300 in FIG. 1 may have the downset having one free end 5331 having a corner 5336 which faces, in a closest manner, the second lead 5105. The corner 5336 may have a round shape. The corner 5336 may be defined between the bottom 5335 and the side face 5333. The first angle defined between the second lead 5105 of the lead frame 5100 and the side face 5333 may be acute to form a first trap region to reliably receive therein a solder in the adhesion layer 5450. The second angle defined between the second lead 5105 of the lead frame 5100 and the bottom face 5335 may be acute to form a second trap region to reliably receive therein a solder in the adhesion layer 5450. This may be proved in the photograph as shown in FIG. 5.

Figure 6:
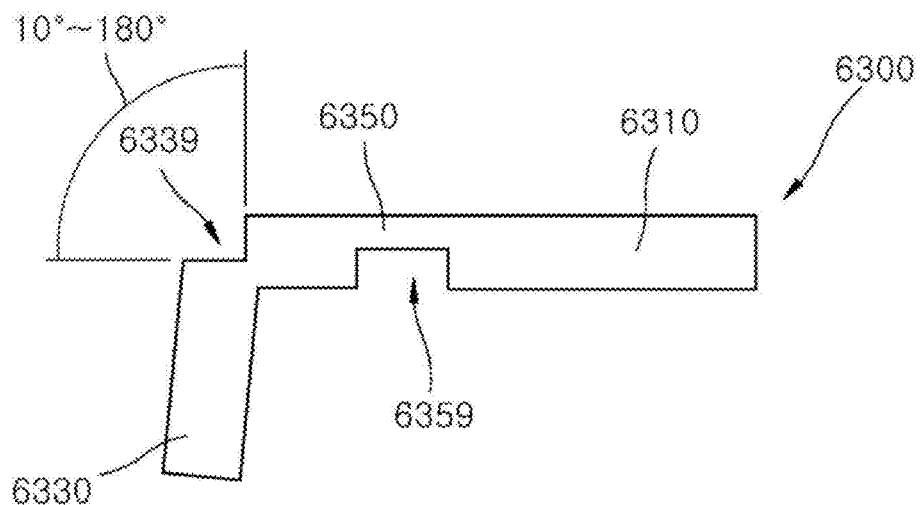
FIG. 6 to FIG. 8 show restoration spring back suppression grooves of clip structures in different embodiments.
Figure 7:
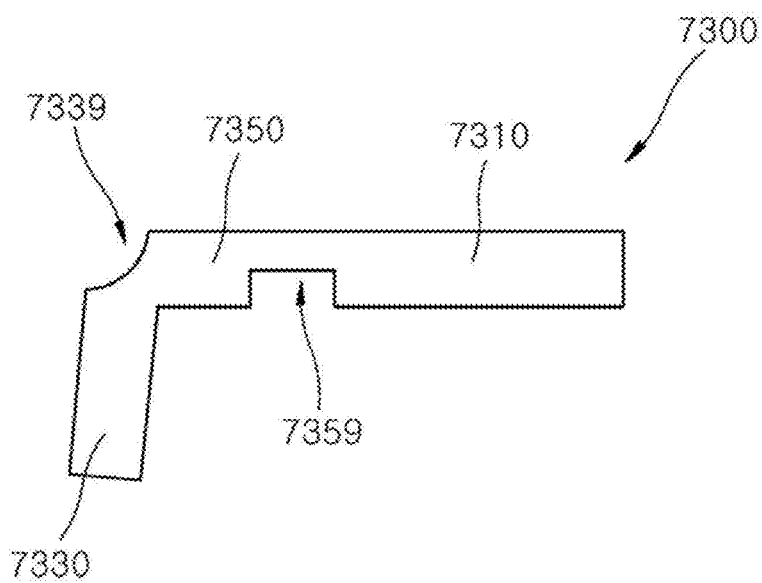
Figure 8:
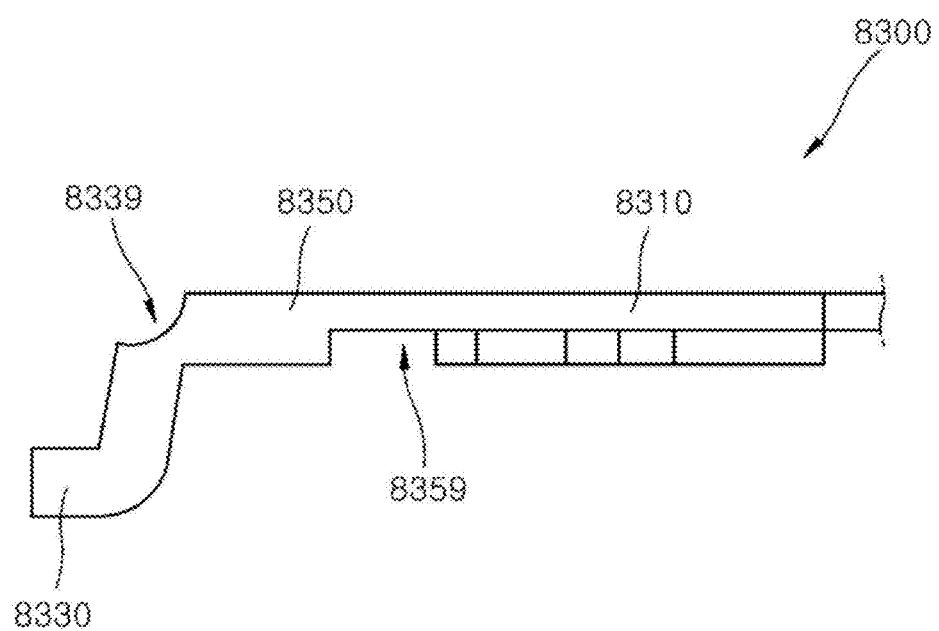

FIG. 6 to FIG. 8 show restoration spring back suppression grooves of clip structures in different embodiments.

Referring to FIG. 6, the clip structure 6300 may include a chip contact portion 6310 and connection portion 6350 and downset 6330. The downset 6330 may extend downwards in a bent form from the connection portion 6350. In this connection, the spring back force to allow the bent portion of the downset 6330 to be restored into a linear extension may be maintained. In order to suppress the restoration, a restoration suppression groove 6339 may be formed in an outer side face of the bent portion between the connection portion 6350 and downset 6330. The restoration suppression groove 6339 may have a V shape having a defined angle along the inner side face thereof, angle being between 10° and 180°. The connection portion 6350 may have a bottom in which a concave groove 6359 may be formed to allow a step between the bottom of the chip contact portion 6310 and the bottom of the connection portion 6350. The concave groove 6359 may act to enlarge the spacing with the edge of the semiconductor chip to suppress the leakage current.

Referring to FIG. 7, the clip structure 7300 may include a chip contact portion 7310 and connection portion 7350 and downset 7330. The downset 7330 may extend downwards in a bent form from the connection portion 7350. In this connection, the spring back force to allow the bent portion of the downset 7330 to be restored into a linear extension may be maintained. In order to suppress the restoration, a restoration suppression groove 7339 may be formed in an outer side face of the bent portion between the connection portion 7350 and downset 7330. The restoration suppression groove 7339 may have a round spherical shape. The connection portion 7350 may have a bottom in which a concave groove 7359 may be formed to allow a step between the bottom of the chip contact portion 7310 and the bottom of the connection portion 7350. The concave groove 7359 may act to enlarge the spacing with the edge of the semiconductor chip to suppress the leakage current.

Referring to FIG. 8, the clip structure 8300 may include a chip contact portion 8310 and connection portion 8350 and downset 8330. The downset 8330 may extend downwards in a bent form from the connection portion 8350. In this connection, the spring back force to allow the bent portion of the downset 8330 to be restored into a linear extension may be maintained. In order to suppress the restoration, a restoration suppression groove 8339 may be formed in an outer side face of the bent portion between the connection portion 8350 and downset 8330. The restoration suppression groove 8339 may have a round spherical shape. The connection portion 8350 may have a bottom in which a concave groove 8359 may be formed to allow a step between the bottom of the chip contact portion 8310 and the bottom of the connection portion 8350. The concave groove 8359 may act to enlarge the spacing with the edge of the semiconductor chip to suppress the leakage current. The end of the downset 8330 may be re-bent to allow the parallel contact between the re-bent portion and the second lead top face.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A semiconductor package comprising:
a lead frame including a lead and a pad spaced from the lead;
a semiconductor chip mounted on the pad;
a clip structure including a chip contact portion, a downset, and a connection portion connecting the chip contact portion and the downset, wherein the chip contact portion is disposed over and is electrically connected to the semiconductor chip, wherein the downset has a first end coupled to the connection portion and a second opposite end electrically coupled to the lead of the lead frame; and
an adhesion layer disposed between the lead and the second end of the downset to allow adhesion therebetween;
wherein the downset is bent in a non-right angle at the first end thereof such that a bottom face of the second end of the downset is tilted toward a top face of the lead and thus a first side of both sides of the bottom face is closer to the top face of the lead than a second side opposite the first side,
wherein a first trap region is defined between a side face of the second end at the first side and the top face of the lead to trap therein an adhesion material of the adhesion layer, where the first trap region has a first trap angle,
wherein a second trap region is defined between the bottom face of the second end and the top face of the lead to trap therein an adhesion material of the adhesion layer, where the second trap region has a second trap angle, and
wherein the clip structure has a restoration suppression groove formed in an outer side face of a bent portion between the connection portion and the downset, wherein the restoration suppression groove functions to suppress restoration of the bending of the downset.

2. The semiconductor package of claim 1, wherein the first trap angle is in a range between 30° and 90°.

3. The semiconductor package of claim 2, wherein the first trap angle is in a range between 30° and 65°.

4. The semiconductor package of claim 2, wherein the first trap angle is in a range between 45° and 80°.

5. The semiconductor package of claim 1, wherein the second trap angle is in a range between 0° and 60°.

6. The semiconductor package of claim 1, wherein the second end has a sharp edge at the first side of the bottom face.

7. The semiconductor package of claim 1, wherein the second end has a round edge at the first side of the bottom face.

8. The semiconductor package of claim 1, wherein the chip contact portion has a mesa field protruding downwards relative to a bottom of the connection portion, wherein a bottom of the chip contact portion and a bottom of the connection portion have different vertical levels.

9. The semiconductor package of claim 8, wherein the chip contact portion has a concave groove formed therein, wherein a top level of the chip contact portion is lower than a top level of the connection portion.

10. The semiconductor package of claim 1, wherein the clip structure has a groove defined in a bottom thereof between the chip contact portion and the connection portion.

11. The semiconductor package of claim 1, wherein the restoration suppression groove has a V shape having a defined angle along an inner side face thereof, the angle being between 10° and 180°.

12. The semiconductor package of claim 1, wherein the restoration suppression groove has a round spherical shape.

* * * * *